United States Patent [19]

Hirayama

[11] Patent Number: 4,743,957
[45] Date of Patent: May 10, 1988

[54] LOGIC INTEGRATED CIRCUIT DEVICE FORMED ON COMPOUND SEMICONDUCTOR SUBSTRATE

[75] Inventor: Hiromitsu Hirayama, Tokyo, Japan

[73] Assignee: NEC Corporation, Tokyo, Japan

[21] Appl. No.: 858,984

[22] Filed: May 2, 1986

[30] Foreign Application Priority Data

May 2, 1985 [JP] Japan .................................. 60-94905

[51] Int. Cl.[4] .................. H03K 17/30; H03K 19/094; H01L 29/80
[52] U.S. Cl. .................................. 307/450; 307/475; 357/22
[58] Field of Search ...................... 307/448, 450, 475; 357/22

[56] References Cited

U.S. PATENT DOCUMENTS

| | | | |
|---|---|---|---|
| 4,410,815 | 10/1983 | Ransom et al. | 307/448 |
| 4,494,016 | 1/1985 | Ransom et al. | 307/450 |
| 4,496,856 | 1/1985 | Ransom et al. | 307/448 |

Primary Examiner—William D. Larkins
Assistant Examiner—John Lamont
Attorney, Agent, or Firm—Sughrue, Mion, Zinn, Macpeak & Seas

[57] ABSTRACT

A gallium arsenide integrated circuit device compatible with a silicon emitter-coupled logic device includes a plurality of transistors constituting an logic circuit and an output transistor driving an externally provided load in response to an output of the logic circuit. The output transistor has its threshold voltage that is larger in absolute value than the threshold voltages of the remaining transistor, so that an output signal having the ECL level is produced without sacrificing a power consumption and a semiconductor chip area.

1 Claim, 4 Drawing Sheets

LOGIC INTEGRATED CIRCUIT DEVICE FORMED ON COMPOUND SEMICONDUCTOR SUBSTRATE

BACKGROUND OF THE INVENTION

The present invention relates to a logic integrated circuit device formed on a compound semiconductor substrate, and more particularly to such a device which is compatible with a silicon emitter-coupled logic integrated circuit device.

As well known in the art, an integrated circuit device formed on a substrate of compound semiconductor, typically of gallium arsenide, (hereafter a "GaAs IC") attains very high speed operation, and therefore it is desired that a silicon emitter-coupled logic integrated circuit device (Si-ECL IC) which is usually employed in a high speed system is replaced by a GaAs IC.

For the GaAs IC to be compatible with a Si-ECL IC, the following three conditions should be satisfied:

(1) Compatibility in power supply voltage and logic levels. More specifically, the power supply voltage of the GaAs IC should be $-5.2V$, and its logic levels should be $-0.7V$ (high level) and $-1.9V$ (low level).

(2) Compatibility in logic operation. In particular, true and complementary signals should be produced without a time delay.

(3) Compatibility in a load drive capability. A load of $50\Omega$ should be driven directly.

The inventor developed a prototype GaAs IC which satisfied the above three conditions, but at the sacrifice of power consumption and a semiconductor chip area. More specifically, some of transistors in the prototype GaAs IC were connected in series between power supply terminals. The power supply voltage applied to the IC was $-5.2V$, so that each of the series-connected transistors was supplied with a small voltage across its source and drain. Therefore, the threshold voltage thereof had to be designed to be of a shallow value. All the transistors in the prototype GaAs IC were fabricated through the same steps, and thus took the same threshold voltage. As a result, the threshold voltage of an output transistor became shallow inevitably. On the other hand, the output transistor should drive the $50\Omega$ load and produce an output signal having the ECL level. Therefore, the output transistor is required to have a considerably large current ability. In order for the output transistor to have a large current ability with a shallow threshold voltage, its gate width was made remarkably large. As a result, the output transistor occupied a lot of area on the semiconductor chip.

A large gate width increases the input stray capacitance of the output transistor. For this reason, a plurality of buffer amplifiers were required to drive the output transistor. As a result, much power was consumed by the buffer amplifiers. The amplifiers also increased the chip area.

SUMMARY OF THE INVENTION

Therefore, an object of the present invention is to provide a logic integrated circuit device operating at a very high speed with low power consumption and a small chip area.

Another object of the present invention is to provide a compound semiconductor integrated circuit device that is compatible with a silicon emitter-coupled logic device with lower power consumption and a smaller chip area.

A logic integrated circuit device according to the present invention comprises a compound semiconductor substrate, a plurality of transistors formed on the substrate and constituting a logic circuit, and an output transistor formed on the substrate and driving a load in response to a signal derived from the logic circuit, the output transistor having its threshold voltage larger in absolute value than the transistors constituting the logic circuit.

Thus, the output transistor has a deeper threshold voltage and hence a large current value with a considerably small gate width. Therefore, the chip area occupied by the output transistor is made small. The input stray capacitance of the output transistor is also decreased, and accordingly no more than one buffer amplifier is required to drive the output transistor. Power consumption is thereby reduced and the chip area is further decreased.

BRIEF DESCRIPTION OF THE DRAWINGS

The above and other objects, advantages and features of the present invention will be more apparent from the following description taken in conjunction with the accompanying drawings, in which.

DESCRIPTION OF PRIOR ART

Figure 1:
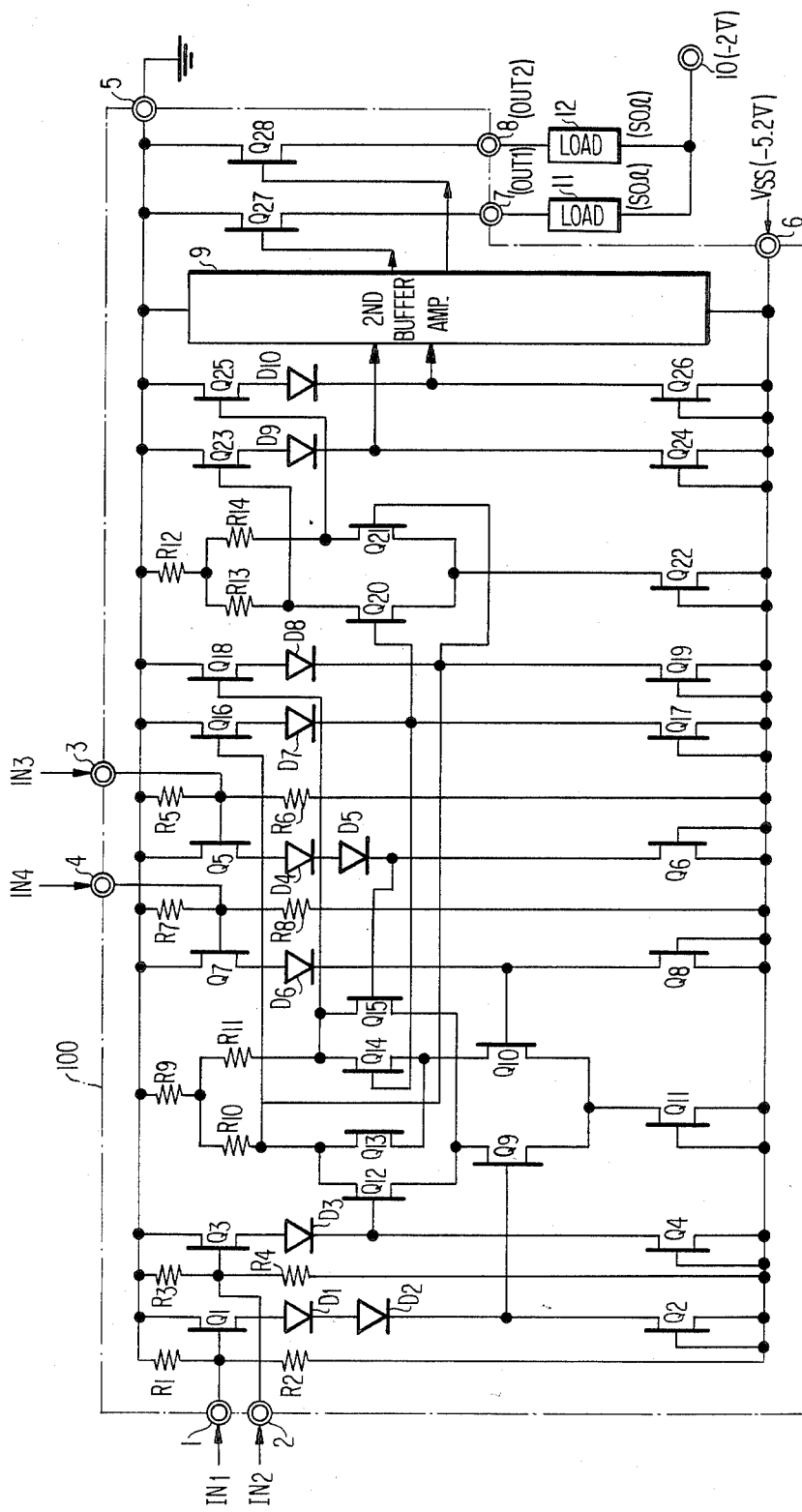
FIG. 1 is an equivalent circuit diagram of a prototype GaAs IC.

With reference to FIG. 1, a prototype GaAs IC will be described in order to facilitate the understanding of the present invention.

Figure 2:
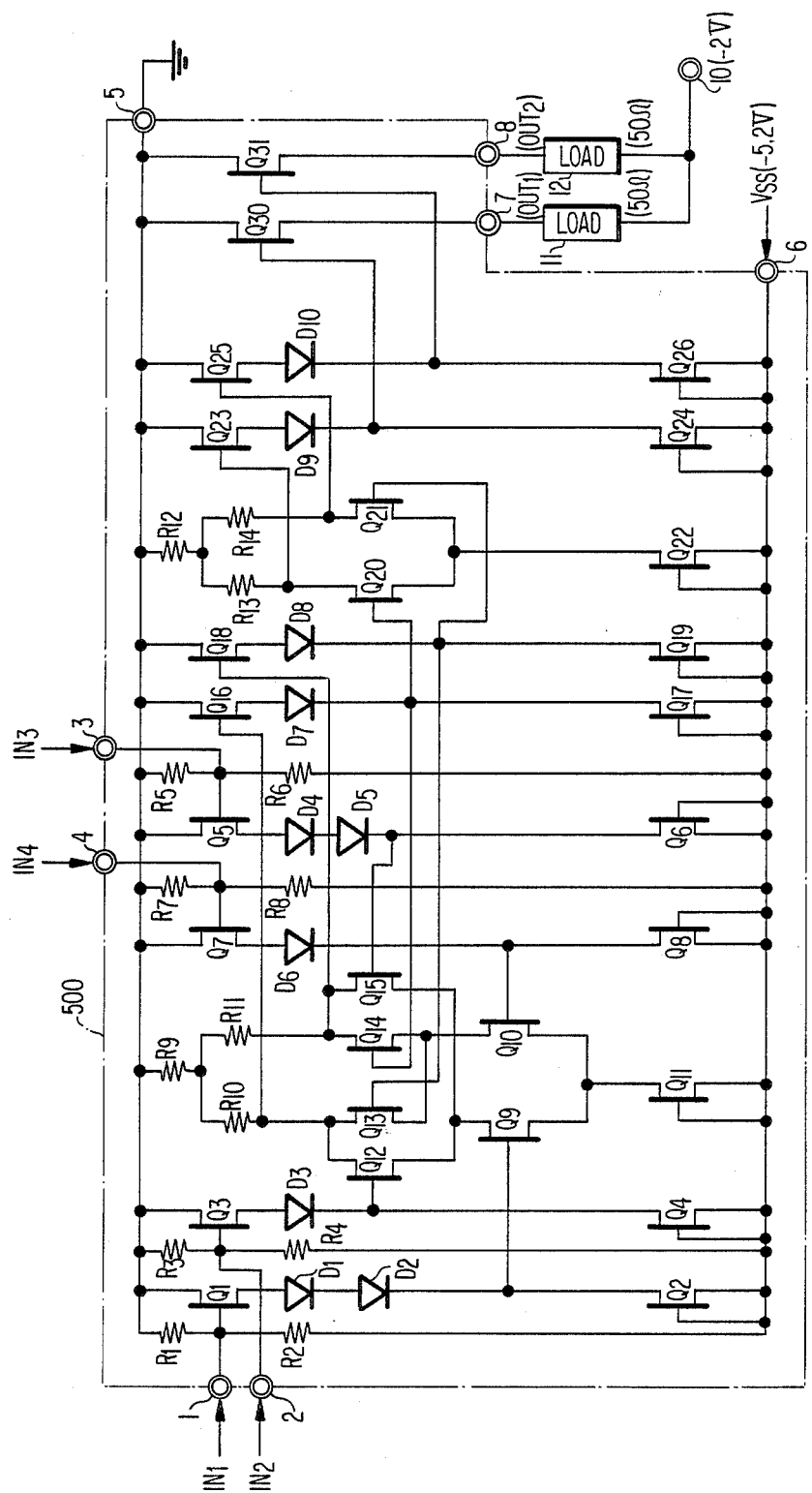
FIG. 2 is an equivalent circuit diagram of a GaAs IC according to an embodiment of the present invention.

In FIG. 2, a GaAs IC 100 has four input terminals 1 to 4, two output terminals 7 and 8, and two power supply terminals 5 and 6. The first input terminal 1 is connected to the gate of a transistor $Q_9$ via a first input circuit which is composed of a source follower transistor $Q_1$, a current source transistor $Q_2$, two level shift diodes $D_1$ and $D_2$, and two bias resistors $R_1$ and $R_2$. The second input terminal 2 is connected to the gate of a transistor $Q_{12}$ through a second input circuit composed of a source follower transistor $Q_3$, a current source transistor $Q_4$, a level shift diode $D_3$, and bias resistors $R_3$ and $R_4$. The third input terminal 2 is connected via a third input circuit to the gate of a transistor $Q_{15}$. The third input circuit is composed of a source follower transistor $Q_5$, a current source transistor $Q_6$, level shift diodes $D_4$ and $D_5$, and bias resistors $R_5$ and $R_6$. The fourth input terminal 4 is connected to the gate of a transistor $Q_{10}$ via a fourth input circuit which is composed of a source follower transistor $Q_7$, a current source transistor $Q_8$, a level shift diode $D_6$, and bias resistors $R_7$ and $R_8$.

The transistors $Q_9$ and $Q_{10}$ constitute a differential circuit, and the source connection point thereof is connected to a current source transistor $Q_{11}$. The transistors $Q_{12}$ and $Q_{15}$ also constitute a differential circuit, and a transistor $Q_9$ operates as a current source thereof. A transistor $Q_{11}$ operates as a current source of a differential circuit composed of the transistors $Q_{13}$ and $Q_{14}$. The drains of the transistors $Q_{12}$ and $Q_{13}$ are connected in common to one end of a load resistor $R_{10}$ and further to the gate of a transistor $Q_{16}$. The drains of the transistors $Q_{14}$ and $Q_{15}$ are connected in common to one end of a load resistor $R_{11}$ and to the gate of a source follower transistor $Q_{18}$. The other ends of the load resistors $R_{10}$ and $R_{11}$ are connected via a level adjusting resistor $R_9$ to the first power supply terminal 5. The source outputs of the transistors $Q_{16}$ and $Q_{18}$ are fed back through diodes $D_7$ and $D_8$ to the gates of the transistors $Q_{14}$ and $Q_{13}$, respectively. Transistors $Q_{17}$ and $Q_{19}$ constitute a current source. The transistors $Q_9$ to $Q_{15}$ and the resistors $R_9$ to $R_{11}$ thus constitutes a differential type logic circuit which functions as a latch circuit.

The outputs of the source follower transistors $Q_{16}$ and $Q_{18}$ are supplied through the diodes $D_7$ and $D_8$ to a first buffer amplifier which is composed of transistors $Q_{20}$ to $Q_{26}$, resistors $R_{12}$ to $R_{14}$ and diodes $D_9$ and $D_{10}$. In this buffer amplifier, the transistors $Q_{20}$ and $Q_{21}$ are connected in a differential form, and the transistor $Q_{22}$ is a current source. The resistors $R_{13}$ and $R_{14}$ are load resistors and $R_{12}$ is a level adjusting resistor. The transistors $Q_{23}$ to $Q_{26}$ and the diodes $D_9$ and $D_{10}$ constitute a level shift circuit. The outputs of the first buffer amplifier are supplied to a second buffer amplifier 9. The second buffer amplifier 9 has the same construction as the first amplifier and therefore is represented as a block circuit.

The outputs of the second buffer amplifier 9 are supplied respectively to source follower transistors $Q_{27}$ and $Q_{28}$ which have their sources connected respectively to the output terminals 7 and 8 and operate as output transistors. The output terminals 7 and 8 are connected respectively to an external power terminal 10 and further to a subsequent stage circuit (not shown).

Each of the transistors $Q_1$ to $Q_{28}$ is an N-channel type Schottky junction type field effect transistor.

The inventor developed the prototype GaAs IC 100, and so established that the IC 100 sacrificed the power consumption and the chip area for the compatibility with an Si-ECL IC and for high speed operation.

More specifically, the latch circuit including the transistors $Q_9$ to $Q_{15}$ and the buffer amplifiers employed a differential type logic circuit to produce true and complementary signals. The above-mentioned condition (2) for the compatibility was thus satisfied. For the condition (1), the first power supply terminal 5 was grounded and the second power supply terminal 6 was applied with a Vss potential of $-5.2$V. Input terminals 1, 4 and 2, 3 were used respectively as a pair of input terminals. Accordingly, one of the terminals 1 and 4 and one of those 2 and 3 were often in an open state. Each of input signals $IN_1$ to $IN_4$ took an ECL level in which a high level and a low level were $-0.7$V and $-1.9$V, respectively. Therefore, the resistance values of the resistors $R_1$, $R_3$, $R_5$ and $R_7$ were 1.3K$\Omega$, and those of the resistors $R_2$, $R_4$, $R_6$ and $R_8$ were 4.9K$\Omega$, so that the gate biases of the transistors $Q_1$, $Q_3$, $Q_5$ and $Q_7$ were designed to be at a level between the high level and the low level of the input signal IN. As a result, compatibility was also satisfied with respect to the input signal logic level.

Electron mobility in a gallium arsenide semiconductor is larger than that in a silicon semiconductor, and in order to get this effect sufficiently, all the transistors in the GaAs IC are required to operate in their saturated region in which a drain current is approximately constant with respect to the change in drain-source voltage. Therefore, the following relationship (1) should be satisfied:

$$V_{DS} > V_{DS(SAT)} = V_{GS} - V_T \quad (1)$$

wherein $V_{DS}$ is a voltage between source and drain; $V_{DS(SAT)}$ is a drain-source voltage at a saturation point; $V_{GS}$ is a gate-source voltage; and $V_T$ is a threshold voltage. The conductance of the transistor is increased by a large $V_{GS}$, so that the transistor operates at a high speed. However, when $V_{GS}$ exceeds 0.6V, the Schottky gate is forward biased, so that gate current flows. Therefore, $V_{GS}$ is designed to be within a range between 0.4V and 0.6V.

Turning back to FIG. 2, in the latch circuit composed of the transistors $Q_9$ to $Q_{15}$ and the resistors $R_9$ to $R_{11}$, a current path was formed between the power supply terminals 5 and 6, which consisted of the resistor $R_9$, the resistor $R_{10}$ (or $R_{11}$), the transistor $Q_{12}$ (or $Q_{13}$, $Q_{14}$, $Q_{15}$), the transistor $Q_9$ (or $Q_{10}$), and the transistor $Q_{11}$. In other words, three transistors, one load resistor and one level adjusting resistor were connected in series between the power terminals 5 and 6. The absolute value of the power voltage was 5.2V. Accordingly, assuming that the voltage drop across the level adjusting resistor $R_9$ was $V_{R9}$ and that across the load resistor $R_{10}$ (or $R_{11}$) was $V_{LS}$, a voltage $V_{DSA}$ supplied across the series connection of three transistors was as follows:

$$V_{DSA}(=3V_{DS}) = 5.2 - V_{R9} - V_{LS} \quad (2)$$

The voltage drop $V_{LS}$ across the resistor $R_{10}$ (or $R_{11}$) was an amplitude of signals supplied to the transistors $Q_{14}$ (or $Q_{13}$) and $Q_{20}$ (or $Q_{21}$) and took 2V to obtain a switching operation in these transistors. The voltage drop $V_{R9}$ across the resistor $R_9$ required 0.6V in order for the transistors $Q_{12}$, $Q_{13}$ and $Q_{14}$, $Q_{15}$ to operate in a differential form. Therefore, the voltage $V_{DSA}$ was less than 2.6V, from equation (2). The respective drain-source voltages of the three series-connected transistors were thus about 0.8V. As mentioned hereinbefore, the gate-source voltage $V_{GS}$ of 0.4 to 0.6V was supplied to each of those three transistors. As a result, the threshold voltage $V_T$ of the respective transistors took $-0.2$ to $-0.3$V from the relationship (1) and could not be designed to be deeper than this value. All the transistors in the IC 100 were manufactured by the same steps, and therefore the remaining transistors $Q_1$ to $Q_8$ and $Q_{16}$ to $Q_{28}$ also took their threshold voltage of $-0.2$ to $-0.3$V.

For the condition (3) in the compatibility with the Si-ECL IC, one end of each of the 50$\Omega$ loads 11 and 12 were connected directly to the output terminals 7 and 8, respectively. It was apparent that output signals $OUT_1$ and $OUT_2$ derived from the output terminals 7 and 8 had to take $-0.7$V high level and $-1.9$V low level. When the output transistors $Q_{27}$ and $Q_{28}$ were OFF, the output signals $OUT_1$ and $OUT_2$ took the low level of about $-1.9$V, because the other end of each of the loads 11 and 12 were connected to the potential terminal 10 supplied with $-2$V. In order to obtain the high level of about $-0.7$V, the output transistors $Q_{27}$ and $Q_{28}$ were required to have current ability of 20 to 24 mA. Such relatively large current ability was realized by increasing considerably the gate width of the transistors $Q_{27}$ and $Q_{28}$.

Figure 3:
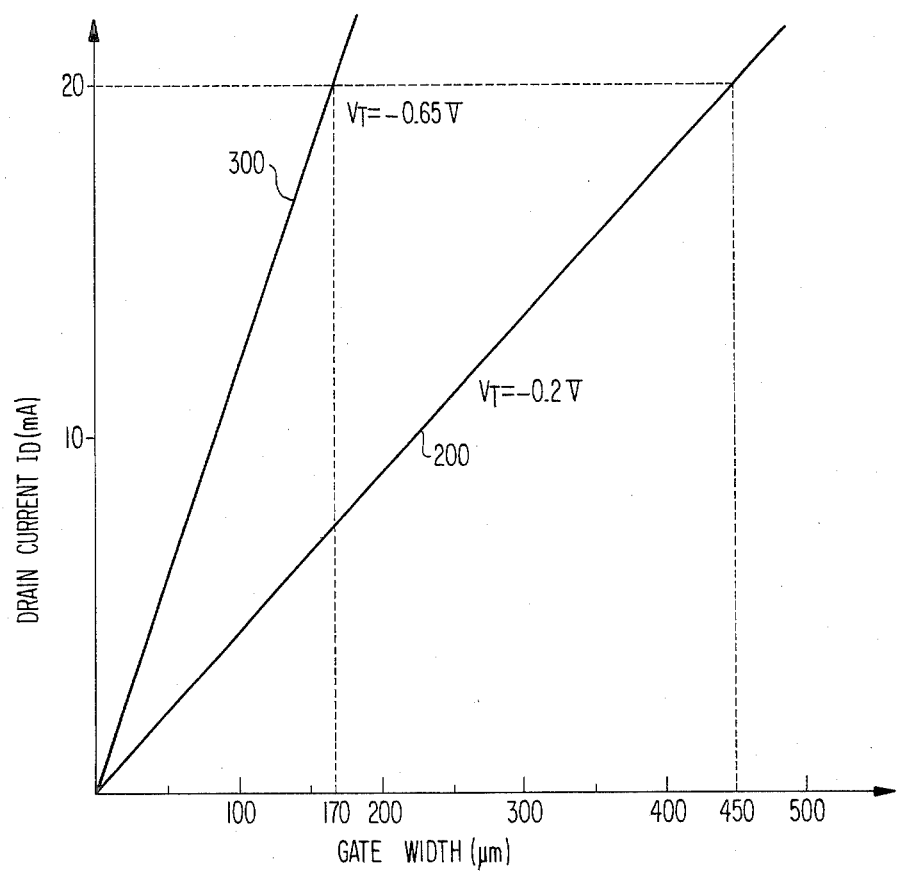
FIG. 3 is a graph showing a relationship between a gate width and a drain current of a Schottky junction field effect transistor.

FIG. 3 shows the relationship of the drain current $I_{DS}$ to the gate width. Since the threshold voltages $V_T$ of the transistors $Q_{27}$ and $Q_{28}$ were $-0.2$V, that relationship is represented by a line 200. The gate width of 450 $\mu$m was necessitated for the current ability of 20 mA.

Thus, the GaAs IC 100 required the considerably large sized output transistors $Q_{27}$ and $Q_{28}$, so that the area of a semiconductor chip was enlarged. Since the gate widths of the transistors $Q_{27}$ and $Q_{28}$ were large, their input stray capacitors were made remarkably large. For this reason, it was impossible to drive the transistors $Q_{27}$ and $Q_{28}$ only by the transistors $Q_{23}$ and $Q_{25}$ at high speed. Therefore, the second buffer amplifier 9 was inserted between the first amplifier and the output transistors. More than two buffer amplifiers often were provided. The respective transistors in the buffer amplifier 9 were required to have a relatively large gate width in order to drive a considerably large load capacitance, so that the power consumption of the amplifier was increased. The chip area was further enlarged.

As described above, the GaAs IC 100 compatible with the Si-ECL IC consumed much power and required a large chip area.

DETAILED DESCRIPTION OF THE INVENTION

FIG. 2 shows an equivalent circuit of a GaAs IC 500 according to an embodiment of the present invention. In the present IC 500, output transistors are represented by $Q_{30}$ and $Q_{31}$ and have a threshold voltage that is smaller (or larger in absolute value) than the output transistors $Q_{27}$ and $Q_{28}$ in FIG. 1. Since the transistors $Q_{30}$ and $Q_{31}$ have a small threshold voltage, and they produce the same drain currents as the transistors $Q_{27}$ and $Q_{28}$ with smaller gate width, the transistors $Q_{30}$ and $Q_{31}$ are thereby manufactured with a small size to reduce the chip area. The input stray capacitances of $Q_{30}$ and $Q_{31}$ are also made small. Therefore, the transistors $Q_{30}$ and $Q_{31}$ may be driven by a first buffer amplifier composed of the transistors $Q_{20}$ to $Q_{26}$, the diodes $D_9$ and $D_{10}$ and the resistors $R_{12}$ to $R_{14}$. The second buffer amplifier 9 is thereby unnecessary.

The first to fourth input circuits for the first to fourth input signals $IN_1$ to $IN_4$ and the differential type logic circuit as a latch circuit are the same as those in FIG. 1. The same reference characters are employed. Accordingly, for compatibility with the Si-ECL IC and the high speed operation, the threshold voltages of the transistors $Q_1$ to $Q_{26}$ are $-0.2$ to $-0.3$V, the resistance values of the resistors $R_1$, $R_3$, $R_5$ and $R_7$ are 1.3 k$\Omega$, and the values of the resistors $R_2$, $R_4$, $R_6$ and $R_8$ are 4.9 k$\Omega$. The first power supply terminal 5 is grounded and the terminal 6 is applied with $-5.2$V. The transistors $Q_1$ to $Q_{26}$, $Q_{30}$ and $Q_{31}$ are N-channel type Schottky junction field effect transistors.

In the GaAs IC 500 according to the present embodiment, the threshold voltages of the output transistors $Q_{30}$ and $Q_{31}$ are designed to $-0.65$V. Therefore, the relationship of the drain current to the gate width in the transistors $Q_{30}$ and $Q_{31}$ is represented by a line 300 in FIG. 3. The transistors $Q_{30}$ and $Q_{31}$ have their current ability of 20 mA with their gate widths of 170 $\mu$m. As a result, the sizes of the transistors $Q_{30}$ and $Q_{31}$ is reduced to about one third of that of the transistors $Q_{27}$ and $Q_{28}$.

The input stray capacitance of a transistor also depends on its threshold voltage. However, the increase in input stray capacitance caused by the increase in threshold voltage is suppressed below 20% in this embodiment. As a result, the second buffer amplifier 9 shown in FIG. 1 is deleted. This results in the further decrease in the chip area and a remarkable reduction of power consumption. The semiconductor chip area of the GaAs IC 500 is reduced by 30 to 40% as compared to that of the GaAs IC 100. The power consumption is also decreased similarly.

Thus, the present invention provides a GaAs IC having compatibility with an Si-ECL IC without increasing a power consumption and chip area.

It is desired for a GaAs IC that the rising time and falling time of an output signal are below 100 to 130 psec. In order to satisfy this requirement and obtain an input stray capacitance without necessitating the second buffer amplifier 9 (FIG. 1), the threshold voltages of the output transistors $Q_{30}$ and $Q_{31}$ are favorably designed to be within a range between 0.6V and 0.9V.

FIG. 4 to FIG. 8 show manufacturing steps of the output transistor $Q_{30}$ ($Q_{31}$) and the logic section transistor $Q_9$ ($Q_1$ to $Q_8$ and $Q_{10}$ to $Q_{26}$).

Figure 4:
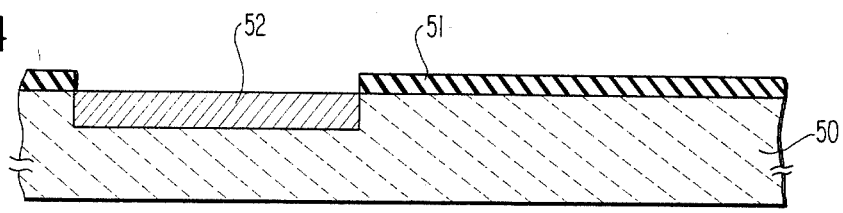
FIG. 4 to FIG. 8 are cross-sectional views of a part of the GaAs IC in FIG. 2 representing manufacturing steps.

As shown in FIG. 4, a semi-insulating gallium arsenide substrate 50 is prepared, and a main surface thereof is covered selectively with a photoresist film 51. Si$^+$ ions are implanted into an exposed portion of the substrate 50 by ion implantation technique to form a channel region 52 of the output transistor $Q_{30}$ ($Q_{31}$).

Figure 5:
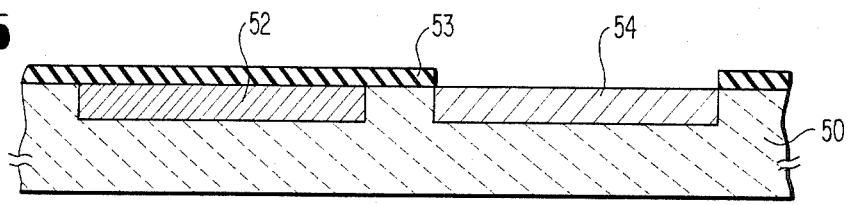

The photoresist film 51 is then removed, and a new photoresist film 53 is formed to cover selectively the surface of the substrate 50, as shown in FIG. 5. Si$^+$ ions are implanted in the selected portion of the substrate 50 to form a channel region 54 of the transistor $Q_9$ ($Q_1$ to $Q_8$ and $Q_{10}$ to $Q_{26}$).

In the ion implantation condition for the channel region 52, the ion energy is 40 KeV, and the dose amount is 5 to 6 $\times 10^{12}$ cm$^{-3}$. On the other hand, the ion energy and the dose amount for the channel region 54 are 40 KeV and 4 $\times 10^{12}$ cm$^{-3}$, respectively. As a result, the channel region 52 presents $-0.6$ to $-0.9$V threshold voltage to the output transistors $Q_{30}$ to $Q_{31}$, and the channel region 54 presents a threshold voltage below $-0.3$V to the transistors $Q_1$ to $Q_{26}$.

Figure 6:
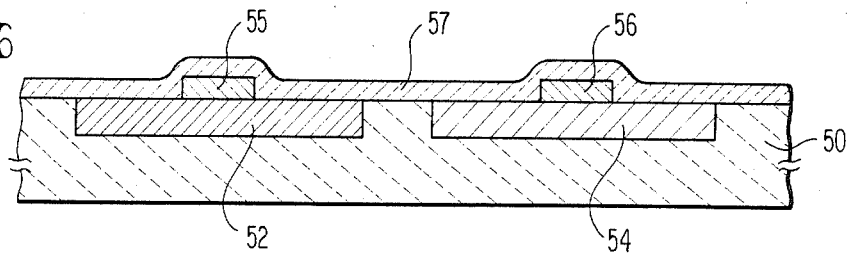

The photoresist film 53 is removed, and a high melting point metal such as a tungsten silicide is deposited over the surface of the substrate 50 by the sputtering method. The high melting point metal is subjected to the selective dry etching, so that Schottky gate electrodes 55 and 56 are formed as shown in FIG. 6. The gate width of the gate 55 is designed to enable the above-mentioned current ability. Thereafter, an insulating film 57 such as silicon dioxide is deposited over the gate electrodes 55 and 56 and the surface of the substrate 50.

Figure 7:
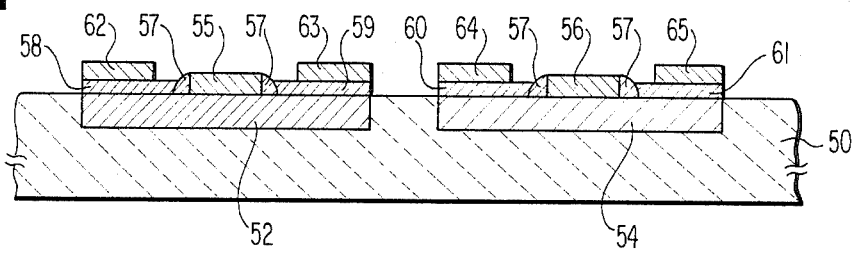

The film 57 is selectively removed, so that the silicon dioxide 57 is left only on the side surfaces of the gate electrodes 55 and 56, as shown in FIG. 7. In order to reduce the internal source and drain resistances and to get a high conductance (gm), high carrier concentration layers 58 to 61 operating as source and drain regions are formed on the channel layers 52 and 54 by the chemical vapor deposition method. The side surface insulating films 57 separate the gate electrodes 55 and 56 from the layers 58 to 61. Since the high carrier concentration layers 58 to 61 are formed on the surfaces of the channel regions 52 and 54, the so-called short channel effect is suppressed remarkably. Moreover, the layers 58 to 61 present a high gm. In this embodiment, the value of gm is above 300 mS/mm. Ohmic electrodes 62 to 65 are thereafter formed, which operate as source and drain electrodes and are made of Au/Ge$-$Ni.

Figure 8:
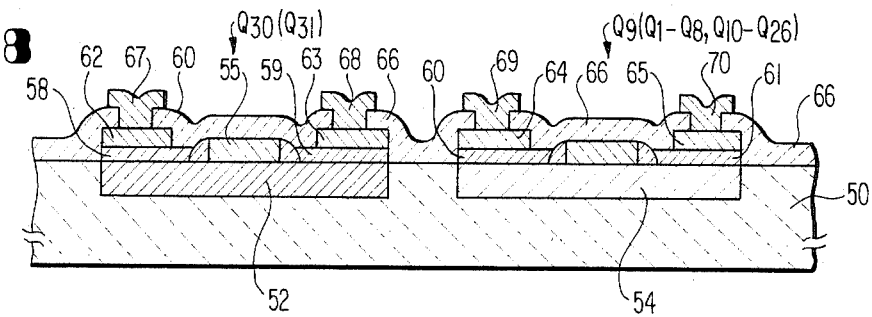

As shown in FIG. 8, an insulating film 66 made of silicon dioxide is formed over the entire surface, and contact holes are formed in the film 66. Interconnection wiring layers 67 to 70 are then formed to construct the circuit shown in FIG. 2.

In this embodiment, only the dose amount is changed to obtain the output transistors $Q_{30}$ and $Q_{31}$ having the deep threshold voltage, and therefore the increase in cost is minimal. It is possible that the ion energy is changed. That is, the carrier concentration of the channel regions of the output transistors $Q_{30}$ and $Q_{31}$ is increased to make the threshold values thereof deep.

The present invention is not limited to the above-described embodiments, but may be modified and changed without departing from the scope and spirit of the present invention. For example, the transistors in the GaAs IC may be of a P-channel type, and output transistors of a source-grounded type may be employed.

What is claimed is:

1. A gallium arsenide integrated circuit device comprising:
   a first power terminal supplied with a ground voltage;
   a second power terminal supplied with a negative voltage substantially equal to $-5.2V$;
   first, second, third and fourth input terminals;
   first and second output terminals;
   a latch circuit including:
      a first resistor connected between said first power terminal and a first node;
      a second resistor connected between said first node and a second node;
      a third resistor connected between said first node and a third node;
      a first Schottky gate field effect transistor having a drain-source path connected between said second node and a fourth node;
      a second Schottky gate field effect transistor having a drain-source path connected between said second node and a fifth node;
      a third Schottky gate field effect transistor having a drain-source path connected between said third and fifth nodes;
      a fourth Schottky gate field effect transistor having a drain-source path connected between said third and fourth nodes;
      a fifth Schottky gate field effect transistor having a drain-source path connected between said fourth node and a sixth node;
      a sixth Schottky gate field effect transistor having a drain-source path connected between said fifth node and said sixth node; and
      a seventh Schottky gate field effect transistor having a drain-source path connected between said sixth node and said second power terminal;
   said device further comprising:
   a first level-shift circuit coupling said first input terminal to a gate of said fifth transistor;
   a second level-shift circuit coupling said second input terminal to a gate of said first transistor;
   a third level-shift circuit coupling said third input terminal to a gate of said fourth transistor;
   a fourth level-shift circuit coupling said fourth input terminal to a gate of said sixth transistor;
   a fifth level-shift circuit coupling said second node to a gate of said third transistor;
   a sixth level-shift circuit coupling said third node to a gate of said second transistor;
   a buffer amplifier including first and second input ends connected to the gates of said second and third transistors, respectively, and first and second output ends;
   an eighth Schottky gate field effect transistor having a gate connected to said first output end of said buffer amplifier and a drain-source path connected between said first power terminal and said first output terminal; and
   a ninth Schottky gate field effect transistor having a gate connected to said second output end of said buffer amplifier and a drain-source path connected between said first power terminal and said second output terminal;
   a threshold voltage of each of said first to seventh transistors being within a range from $-0.2V$ to $-0.3V$ and the threshold voltage of each of said eighth and ninth transistors being within a range from $-0.6V$ to $-0.9V$; whereby first and second output signals each having a logic high level of about $-0.7V$ and an logic low level of about $-1.9V$ are derived respectively from said first and second output terminals when each of said first and second output terminals is connected via a load resistor of $50\Omega$ to a power source of $-2.0V$.

* * * * *